United States Patent
Mii et al.

(10) Patent No.: US 7,025,247 B2
(45) Date of Patent: Apr. 11, 2006

(54) WIRE BONDING METHOD

(75) Inventors: Tatsunari Mii, Tachikawa (JP); Hiroshi Watanabe, Tachikawa (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 64 days.

(21) Appl. No.: 10/781,188

(22) Filed: Feb. 17, 2004

(65) Prior Publication Data

US 2004/0164127 A1    Aug. 26, 2004

(30) Foreign Application Priority Data

Feb. 17, 2003    (JP)    ............................. 2003-038314

(51) Int. Cl.
*B23K 31/02*    (2006.01)

(52) U.S. Cl. ..................................... 228/180.5; 228/4.5

(58) Field of Classification Search ............. 228/180.5, 228/4.5
See application file for complete search history.

(56) References Cited

U.S. PATENT DOCUMENTS

| | | | |
|---|---|---|---|
| 5,485,949 A | * | 1/1996 | Tomura et al. .......... 228/180.5 |
| 6,715,666 B1 | * | 4/2004 | Imai et al. ............... 228/180.5 |
| 2004/0026480 A1 | * | 2/2004 | Imai et al. ............... 228/110.1 |

FOREIGN PATENT DOCUMENTS

| | | |
|---|---|---|
| JP | 10-112471 | 4/1998 |
| JP | 2002-280410 | 9/2002 |

* cited by examiner

*Primary Examiner*—Kevin Kerns
*Assistant Examiner*—Michael Aboagye
(74) *Attorney, Agent, or Firm*—Koda & Androlia

(57) ABSTRACT

A wire bonding method including the steps of forming a bump by performing ball bonding of a ball by wire on a second conductor, raising a capillary to a height that is equal to or lower than the height of a ball portion that rises into a through-hole of the capillary during formation of the bump, moving the capillary in a direction that is opposite from the first conductor, lowering the capillary so as to form an inclined wedge on the bump, cutting the wire, performing the primary bonding on the first conductor, and making a loop with the wire with respect to the bump from the first conductor, thus performing the secondary bonding on the inclined wedge on the bump.

1 Claim, 3 Drawing Sheets

WIRE BONDING METHOD

BACKGROUND OF THE INVENTION

1. Field of the Invention

The present invention relates to a wire bonding method that performs wire bonding between two conductors.

2. Prior Art

Japanese Patent Application Laid-Open (Kokai) Nos. 10-112471 and 2002-280410 disclose wire bonding methods that connect a wire between a first conductor and a bump on a second conductor after such a bump is formed on the second conductor.

In Japanese Patent Application Laid-Open (Kokai) No. 10-112471, a bump is formed by performing ball bonding on the second conductor; and after wedge bonding is performed on the opposite side of the bump from the first conductor, primary bonding is performed on the first conductor. Then, the wire is looped from the first conductor side with respect to the bump, and secondary bonding is performed on the bump.

In Japanese Patent Application Laid-Open (Kokai) No. 2002-280410, after a bump has been formed by performing, using a bonding wire, ball bonding on the second conductor, the capillary is moved upward, and this capillary is then moved to a position that is on the opposite side from the first conductor. The capillary is then again moved downward so that an inclined wedge is formed on the bump, after which primary bonding is performed on the first conductor, the wire is looped from the first conductor side with respect to the bump, and secondary bonding is performed on the inclined wedge that is on the upper part of the bump.

The method of the Japanese Patent Application Laid-Open (Kokai) No. 10-112471 has problems. It involves wedge bonding and joining of the wire that takes place after bump formation; in other words, it involves joining of curved surfaces to each other; as a result, in cases where deviation of the joining position occurs, wire bending occurs as a result, and adjacent wires come into contact with each other. Furthermore, although the generation of a wire tail can be suppressed by forming the wedge bonding after bump formation in a shape that is bent toward the rear, a sufficient inclination and flat surface cannot be ensured in the joining of the wire and bump. Accordingly, contact between the wire and circuit board and contact between the wire and wiring following the joining of the bump and wire cannot be prevented.

In the Japanese Patent Application Laid-Open (Kokai) No. 2002-280410, a bump is formed by performing ball bonding on the wiring part, and the capillary is then raised and moved from the center of the bump into the opposite direction from the first conductor, after which the capillary is again pressed downward so that an inclined wedge is formed on the bump by the outer wall surface of the capillary, and secondary bonding is performed on the inclined wedge. Thus, problems seen in Japanese Patent Application Laid-Open (Kokai) No. 10-112471 does not occur in the method of the Japanese Patent Application Laid-Open (Kokai) No. 2002-280410.

In the method of Japanese Patent Application Laid-Open (Kokai) No. 2002-280410, the capillary is pressed down to the bump so as to form an inclined wedge on the bump using the outer wall surface of the capillary. Thus, an inclination and flat surface of the bump are wider than those in the method of Japanese Patent Application Laid-Open (Kokai) No. 10-112471. However, in Japanese Patent Application Laid-Open (Kokai) No. 10-112471, the inclined wedge is formed on the bump after the capillary has been moved upward to the wire portion following the bump formation; accordingly, a more sufficiently wide flat surface is not formed. A narrow surface area on the inclined wedge causes unreliable bonding, and the secondarily bonded wire can be easily bent. Thus, a stable wire loop is not obtainable.

SUMMARY OF THE INVENTION

The object of the present invention is to provide a wire bonding method which that forms a sufficiently wide inclined wedge on a bump, thus obtaining an improved reliability of the bonding joint and a stable wire loop.

The above object is accomplished by unique steps of the present invention for a wire bonding method in which primary bonding is performed on a first conductor, and then secondary bonding is performed on a second conductor, thus wire-bonding between the first conductor and second conductor; and in the present invention, the method comprises the steps of: forming a bump by performing ball bonding by wire on the second conductor, raising a capillary to a height that is equal to or lower than the height of a ball portion that rises into a through-hole of the capillary during formation of the bump, moving the capillary in a direction that is opposite from the first conductor, lowering the capillary so as to form an inclined wedge on the bump, cutting the wire, performing the primary bonding on the first conductor, and making a loop with the wire with respect to the bump from the first conductor, thus performing the secondary bonding on the inclined wedge on the bump.

DETAILED DESCRIPTION OF THE INVENTION

Figure 1:
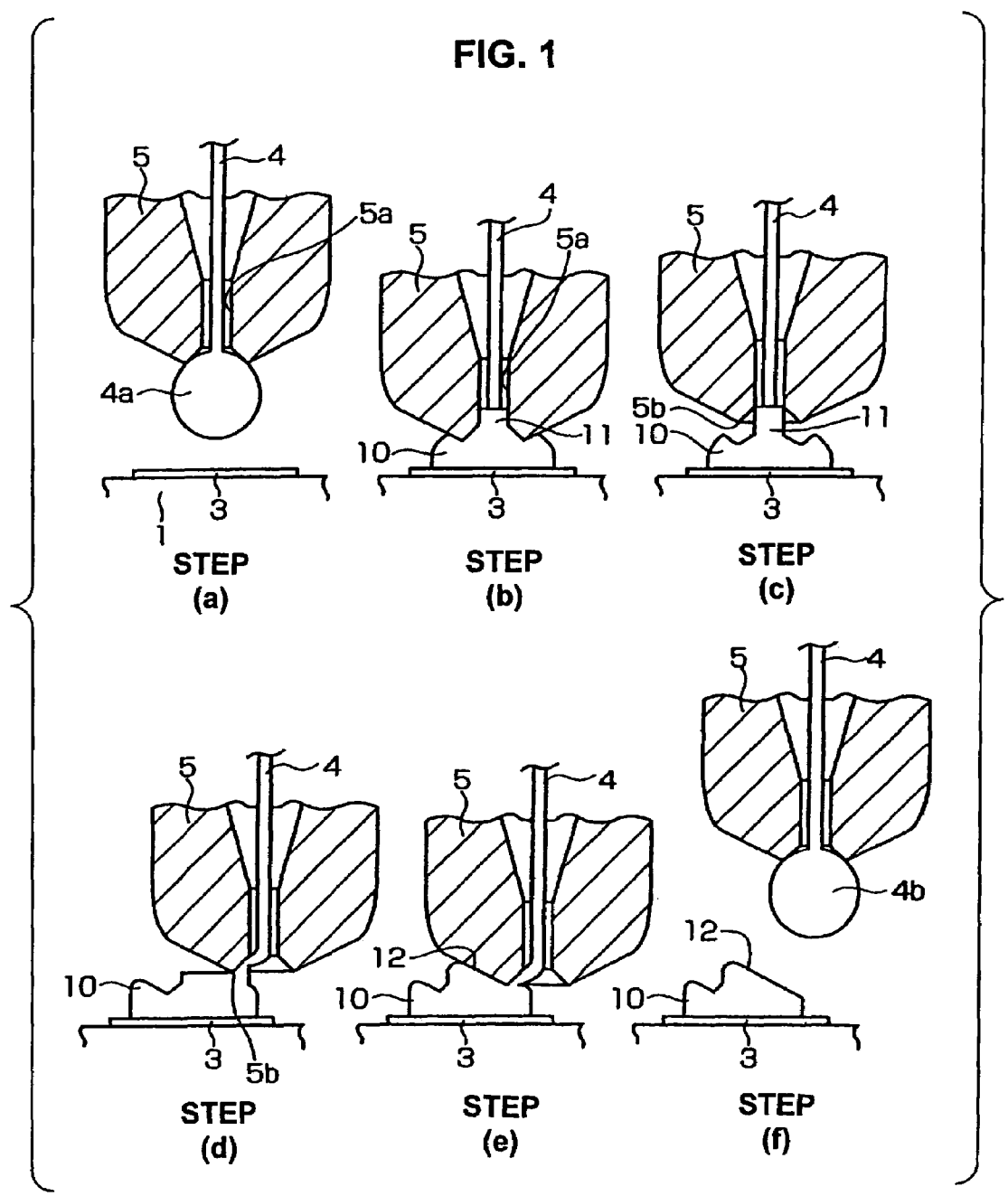
FIG. 1 shows the sequential steps (a) through (f) of the wire bonding method according to one embodiment of the present invention.

The wire bonding method of one embodiment of the present invention will be described below with reference to FIGS. 1 and FIG. 2. In FIG. 2, the step (b) shows the completed state of wire bonding between a die and wiring performed using the wire bonding method of one embodiment of the present invention.

As seen from the step (b) in FIG. 2, a die 2 on which a pad 2*a* is formed is mounted on a circuit board 1 which is a substrate such as a ceramic substrate, printed substrate, etc. or is a lead frame, etc. Wiring 3 is formed on the circuit board 1. A bump 10 is formed on the wiring 3, and a wire 4 is connected between the pad 2*a* and bump 10. The reference numeral 5 is a capillary through which the wire 4 passes.

The wire bonding shown in completed step (b) in FIG. 2 is obtained by the steps described below.

Figure 2:
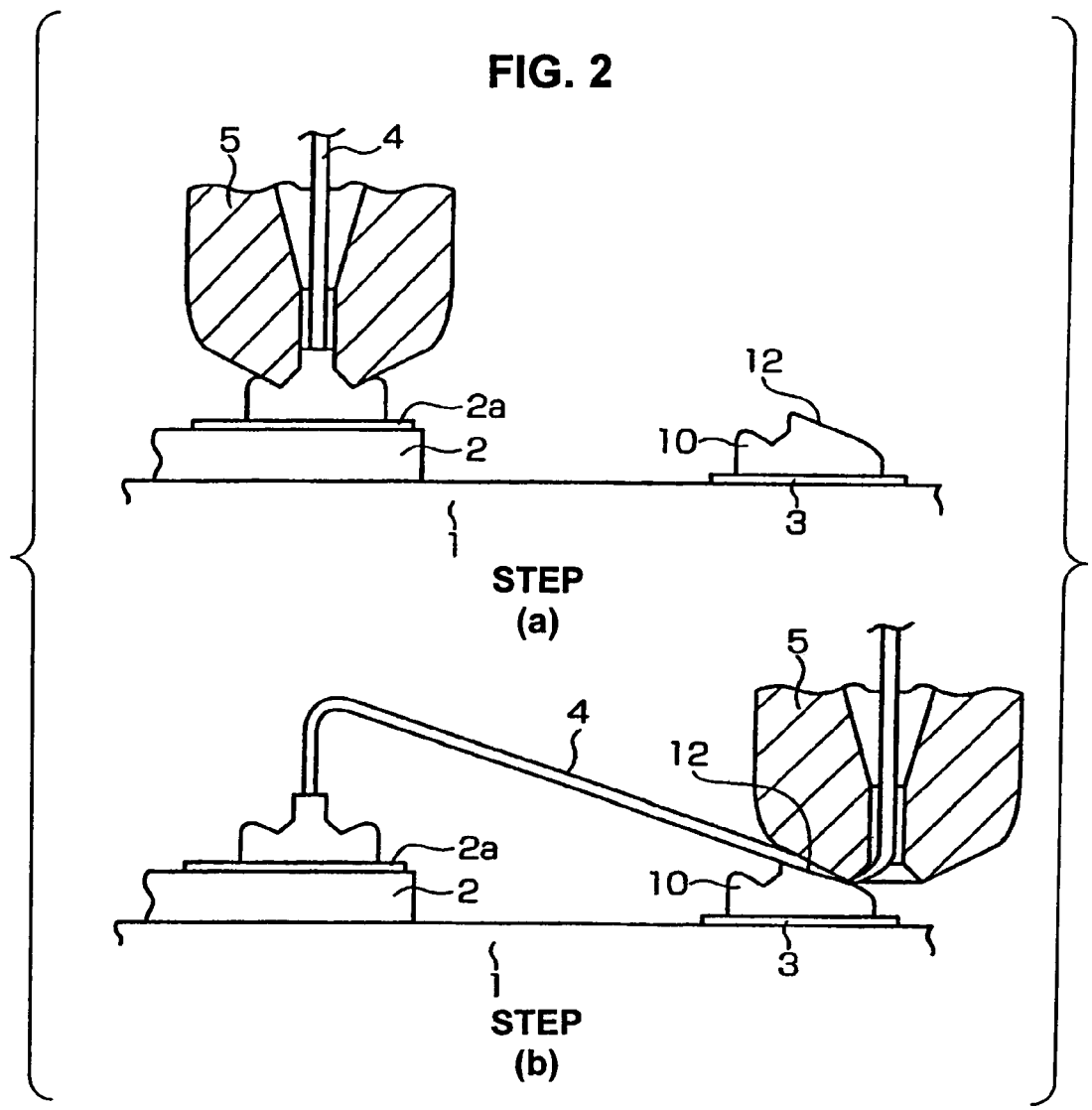
FIG. 2 shows the sequential steps (a) and (b), the step (a) in FIG. 2 following the last step (f) shown in FIG. 1.

First, as shown in step (a) of FIG. 1, a ball 4*a* is formed by an electric torch (not shown) on the tip end of the wire 4 that passes through the through-hole 5*a* of the capillary 5.

Next, in step (b), the capillary 5 is lowered and ball bonding is performed on the wiring 3. As a result, a portion of the ball 4a rises into the interior of the through-hole 5a, so that a hole portion 11 is formed on the bump 10.

Then, in step (c), the capillary 5 is raised so that the edge 5b of the lower end of the capillary 5 is positioned at a level equal to or lower than the height of the hole portion 11.

Next, in step (d) of FIG. 1, the capillary 5 is moved in the opposite direction from the pad 2a side (see the (b) of FIG. 2).

Then, in step (e), the capillary 5 is lowered so that an inclined wedge 12 is formed on the bump 10 by the lower end surface of the capillary 5, after which the capillary 5 is raised and the wire 4 is cut. Since the capillary 5 is thus lowered to form an inclined wedge 12 on the surface of the bump 10 after the hole portion 11 has been pushed in the lateral direction by the edge 5b of the capillary 5, an inclined wedge 12 with a more sufficiently wide surface area and a flat surface is formed.

Next, in step (f), a ball 4b is formed on the tip end of the wire 4 by an electric torch.

Then, in step (a) shown in FIG. 2, the capillary 5 is positioned on the pad 2a of the die 2, and primary bonding is performed.

Then in step (b) shown in FIG. 2, the wire 4 is looped so that the wire 4 is positioned on the upper part of the inclined wedge 12 of the bump 10, and the wire 4 is secondarily bonded to the inclined wedge 12, after which the wire 4 is cut.

Figure 3:
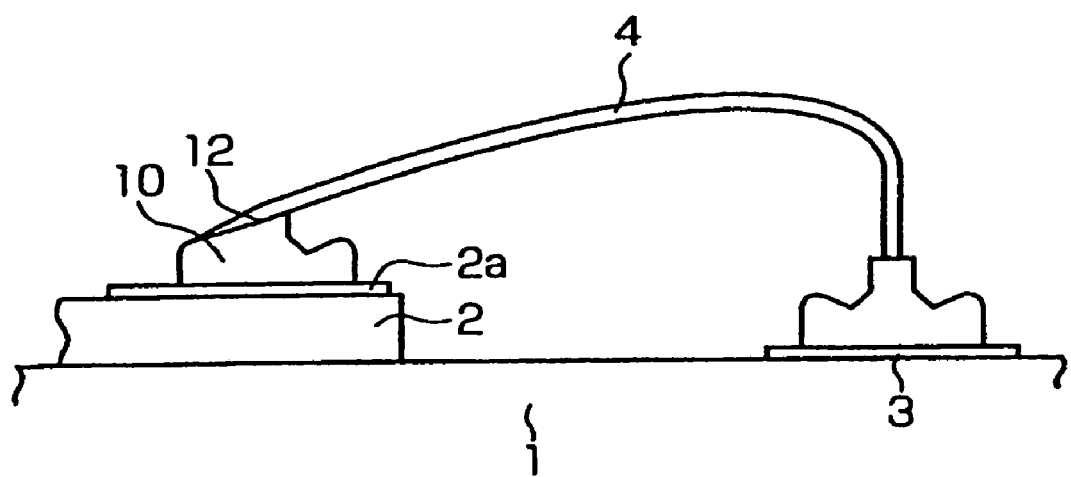
FIG. 3 is a diagram that shows another example of wire bonding between a die and wiring using the wire bonding method of the embodiment of the present invention.

FIG. 3 shows another example of the conditions of wire bonding between a die and wiring using the wire bonding method according to the embodiment of the present invention.

In the embodiment described above, a bump 10 is formed on the wiring 3, the primary bonding is performed on the pad 2a, and the secondary bonding is performed on the inclined wedge 12 on the bump 10.

In the embodiment of FIG. 3, a bump 10 is formed on the pad 2a by the steps (a) through (e) shown in FIG. 1, and the inclined wedge 12 on the bump 10 is formed on the opposite side from the side of the wiring 3.

Then, primary bonding is performed on the wiring 3 by the steps (a) and (b) shown in FIG. 2, after which secondary bonding is performed on the inclined wedge 12 on the bump 10, and then the wire 4 is cut.

In other words, in the case of the steps (a) of FIG. 1 through step (b) in FIG. 2, the pad 2a is the first conductor, and the wiring 3 is the second conductor. In the case of FIG. 3, the wiring 3 is the first conductor, and the pad 2a is the second conductor.

As seen from the above, the present invention is for a wire bonding method in which primary bonding is performed on a first conductor, and then secondary bonding is performed on a second conductor, thus wire-bonding between the first conductor and second conductor; and the present invention comprises the steps of: forming a bump by performing ball bonding by wire on the second conductor, raising a capillary to a height that is equal to or lower than the height of a ball portion that rises into a through-hole of the capillary during formation of the bump, moving the capillary in a direction that is opposite from the first conductor, lowering the capillary so as to form an inclined wedge on the bump, cutting the wire, performing the primary bonding on the first conductor, and making a loop with the wire with respect to the bump from the first conductor, thus performing the secondary bonding on the inclined wedge on the bump. Accordingly, an inclined wedge with a more sufficiently wide area is formed on the bump, so that an improvement in the reliability of the bonding joint and a stable wire loop is assured.

The invention claimed is:

1. A wire bonding method in which primary bonding is performed on a first conductor, and then secondary bonding is performed on a second conductor, thus wire-bonding between said first conductor and second conductor, said method comprising the ordered steps of:

forming a ball on an end of a wire extending through a through-hole in a capillary;

forming a bump by pressing said ball of said wire onto said second conductor with said capillary until said bump is formed with a portion of said ball on said wire rising into said through-hole in said capillary, raising said capillary to a height that is equal to or lower than a height of said portion of said ball that rises into said through-hole of said capillary during formation of said bump, moving said capillary in a direction opposite from said first conductor, lowering said capillary so as to form an inclined wedge on said bump, cutting said wire, performing said primary bonding on said first conductor, and making a loop with said wire with respect to said bump from said first conductor, thus performing said secondary bonding on said inclined wedge on said bump.

* * * * *